US012588562B2

(12) United States Patent
Baek

(10) Patent No.: US 12,588,562 B2
(45) Date of Patent: Mar. 24, 2026

(54) SEMICONDUCTOR PACKAGE

(71) Applicant: Samsung Electronics Co., Ltd., Suwon-si (KR)

(72) Inventor: Kiwon Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 290 days.

(21) Appl. No.: 18/135,623

(22) Filed: Apr. 17, 2023

(65) Prior Publication Data

US 2023/0420414 A1      Dec. 28, 2023

(30) Foreign Application Priority Data

Jun. 24, 2022      (KR) ......................... 10-2022-0077811

(51) Int. Cl.
| | |
|---|---|
| *H01L 25/065* | (2023.01) |
| *H01L 23/00* | (2006.01) |
| *H10B 80/00* | (2023.01) |

(52) U.S. Cl.
CPC .......... *H01L 25/0652* (2013.01); *H01L 24/16* (2013.01); *H01L 24/32* (2013.01); *H01L 24/48* (2013.01); *H01L 24/73* (2013.01); *H10B 80/00* (2023.02); *H01L 2224/16225* (2013.01); *H01L 2224/32145* (2013.01); *H01L 2224/32225* (2013.01); *H01L 2224/48149* (2013.01); *H01L 2224/48229* (2013.01); *H01L 2224/73215* (2013.01); *H01L 2924/1436* (2013.01)

(58) Field of Classification Search
CPC ........... H01L 25/0657; H01L 23/49816; H01L 23/49833; H01L 2225/06506; H01L 2225/0651; H01L 2225/06562; H01L 23/49838; H01L 24/32; H01L 24/48; H01L 24/73; H01L 2224/32145; H01L 2224/32225; H01L 2224/48091; H01L 2224/48145; H01L 2224/48227; H01L 2224/73265; H01L 2924/00014; H01L 2924/14; H01L 2924/15311; H01L 2924/181; H01L 23/13
USPC ....................................................... 438/122
See application file for complete search history.

(56) References Cited

U.S. PATENT DOCUMENTS

| | | | |
|---|---|---|---|
| 7,332,820 | B2 | 2/2008 | Tan et al. |
| 7,944,037 | B2 | 5/2011 | Nishiyama et al. |
| 8,110,440 | B2 | 2/2012 | Bathan et al. |
| 9,240,393 | B2 * | 1/2016 | Yu ....................... H01L 23/3135 |

(Continued)

*Primary Examiner* — Vu A Vu

(74) *Attorney, Agent, or Firm* — Muir Patent Law, PLLC

(57) ABSTRACT

Provided is a semiconductor package including a package substrate including a substrate pad, a first chip stacked structure including a first base chip mounted on an upper surface of the package substrate, and one or more first stacked chips sequentially offset-stacked along a first direction on the first base chip, a second chip stacked structure including a second base chip offset-stacked along the first direction on an upper surface of the first chip stacked structure, and one or more second stacked chips sequentially offset-stacked along the first direction on the second base chip, a bonding wire, and a first support mounted on the package substrate to be spaced apart from the first chip stacked structure in the first direction and supporting the second chip stacked structure, wherein the first support supports the second chip stacked structure by supporting a lower surface of the second base chip.

20 Claims, 16 Drawing Sheets

(56)          References Cited

U.S. PATENT DOCUMENTS

| | | | |
|---|---|---|---|
| 9,496,216 B2 | 11/2016 | Chun et al. | |
| 9,508,691 B1 * | 11/2016 | Delacruz | H01L 24/45 |
| 9,589,930 B2 * | 3/2017 | Park | H01L 24/49 |
| 10,002,853 B2 * | 6/2018 | Oh | H01L 25/0657 |
| 10,204,892 B2 | 2/2019 | Lee et al. | |
| 10,482,935 B2 * | 11/2019 | Park | G11C 16/32 |
| 10,804,209 B2 * | 10/2020 | Kang | H01L 23/49838 |
| 10,861,826 B2 * | 12/2020 | Oh | H01L 23/5385 |
| 10,971,479 B2 * | 4/2021 | Lee | H01L 25/18 |
| 11,205,638 B2 * | 12/2021 | Choi | H01L 24/49 |
| 11,380,651 B2 * | 7/2022 | Park | H01L 25/0652 |
| 11,682,657 B2 * | 6/2023 | Park | H01L 24/48 |
| | | | 257/686 |
| 11,881,279 B2 * | 1/2024 | Park | G11C 5/04 |
| 2018/0005994 A1 | 1/2018 | Oh | |
| 2020/0091112 A1 | 3/2020 | Do | |
| 2023/0411357 A1 * | 12/2023 | Tanaka | H01L 23/3107 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0077811, filed on Jun. 24, 2022, in the Korean Intellectual Property Office, the disclosure of which is incorporated by reference herein in its entirety.

BACKGROUND

Aspects of the inventive concept relate to a semiconductor package, and more particularly, to a semiconductor package including a chip stacked structure mounted on a package substrate and a support supporting the same.

In accordance with the rapid development of the electronic industry and the needs of users, electronic devices are becoming smaller and lighter. According to the trend of miniaturization and weight reduction of electronic components, a semiconductor package mounted thereon is also required to reduce its volume and have a high-capacity data processing capability.

Accordingly, as the size of semiconductor chips stacked to implement a high-integration semiconductor package decreases, a defect issue in the chip stacked structure frequently occurs. Accordingly, it is important to stabilize the structure of the chip stacked structure.

SUMMARY

Aspects of the inventive concept provides a semiconductor package in which cracks of a semiconductor chip are prevented by stabilizing the structure of a chip stacked structure.

In addition, issues addressed by the technical ideas of the inventive concept are not limited to the above-mentioned issues, and other issues may be clearly understood by those skilled in the art from the following description.

Some aspects of the inventive concept provide the following semiconductor package.

According to an aspect of the inventive concept, there is provided a semiconductor package including a package substrate including a substrate pad, a first chip stacked structure including a first base chip mounted on an upper surface of the package substrate, and one or more first stacked chips sequentially offset-stacked along a first direction on the first base chip, a second chip stacked structure including a second base chip offset-stacked along the first direction on an upper surface of the first chip stacked structure, and one or more second stacked chips sequentially offset-stacked along the first direction on the second base chip, a bonding wire electrically connecting the substrate pad to the first chip stacked structure or the substrate pad to the second chip stacked structure, and a first support mounted on the upper surface of the package substrate to be spaced apart from the first chip stacked structure in the first direction and supporting the second chip stacked structure, wherein the first support supports the second chip stacked structure by supporting a lower surface of the second base chip, and the second base chip is located at a lowermost level among chips each of which has a center that does not vertically overlap the first base chip.

According to another aspect of the inventive concept, there is provided a semiconductor package including a package substrate including a substrate pad, a first chip stacked structure including a first base chip mounted on an upper surface of the package substrate, and one or more first stacked chips sequentially offset-stacked along a first direction on the first base chip, a second chip stacked structure including a second base chip offset-stacked along the first direction on an upper surface of the first chip stacked structure, and one or more second stacked chips sequentially offset-stacked along the first direction on the second base chip, a third chip stacked structure including a third base chip offset-stacked along the first direction on an upper surface of the second chip stacked structure, and one or more third stacked chips sequentially offset-stacked along the first direction on the third base chip, a bonding wire electrically connecting the substrate pad to the first chip stacked structure or the substrate pad to the second chip stacked structure, a first support mounted on the upper surface of the package substrate to be spaced apart from the first chip stacked structure in the first direction and supporting the second chip stacked structure, and a second support spaced apart from the first and second chip stacked structures in a first direction and supporting the third chip stacked structure, wherein the first support supports the second chip stacked structure by supporting a lower surface of the second base chip, wherein the second support supports the third chip stacked structure by supporting a lower surface of the third base chip, wherein the second base chip is located at a lowermost level among chips having respective centers not overlapping the first base chip in a vertical direction, and the third base chip is located at a lowermost level among chips having respective centers not overlapping any part of the first base chip and the second base chip in the vertical direction.

According to another aspect of the inventive concept, there is provided a semiconductor package including a package substrate including a substrate pad, a first chip stacked structure including a first base chip mounted on an upper surface of the package substrate, and one or more first stacked chips sequentially offset-stacked along a first direction on the first base chip, a second chip stacked structure including a second base chip offset-stacked along the first direction on an upper surface of the first chip stacked structure, and one or more second stacked chips sequentially offset-stacked along the first direction on the second base chip, a fourth chip stacked structure including a fourth base chip mounted to be spaced apart from the first base chip in the first direction on the upper surface of the package substrate, and one or more fourth stacked chips sequentially offset-stacked on the fourth base chip in a second direction intersecting the first direction, a fifth chip stacked structure including a fifth base chip offset-stacked along the second direction on an upper surface of the fourth chip stacked structure, and one or more fifth stacked chips sequentially offset-stacked along the second direction on the fifth base chip, and a first support mounted on the upper surface of the package substrate to be spaced apart from the first chip stacked structure in the first direction and spaced apart from the fourth chip stacked structure in the second direction and supporting the second chip stacked structure and the fifth chip stacked structure, wherein the first support supports the second chip stacked structure by supporting a lower surface of the second base chip and supports the fifth chip stacked structure by supporting a lower surface of the fifth base chip, wherein the second base chip is located at a lowermost level among chips having respective centers not overlapping the first base chip in a vertical direction, and the fifth base chip is located at a lowermost level among chips having respective centers not overlapping the fourth base chip in the vertical direction.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
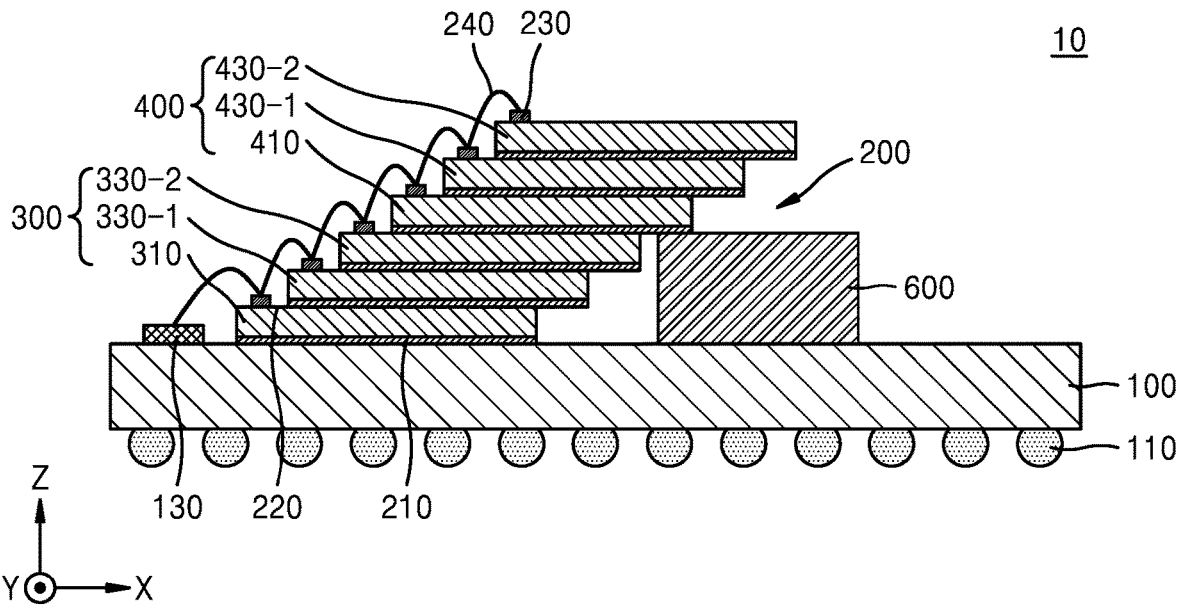
FIG. 1A is a cross-sectional view for explaining a semiconductor package according to an embodiment.

Hereinafter, embodiments of the inventive concept will be described in detail with reference to the accompanying drawings. The same reference numerals are used for the same components in the drawings, and duplicate descriptions thereof are omitted.

In the following drawings, the X-axis direction and the Y-axis direction may indicate a direction parallel to the surface of the package substrate 100, and the X-axis direction and the Y-axis direction may be perpendicular to each other. The Z-axis direction may indicate a direction perpendicular to the surface of the package substrate 100, and the Z-axis direction may be a direction perpendicular to the X-Y plane.

In the following drawings, the first to third directions may be understood as follows. The first direction may be the +X-axis direction, the second direction may be the −X-axis direction which is a direction opposite to the first direction. For example, the first and second directions are antiparallel to each other and are different from each other by 180 degrees, and the third direction may be the Y-axis direction.

Figure 1B:
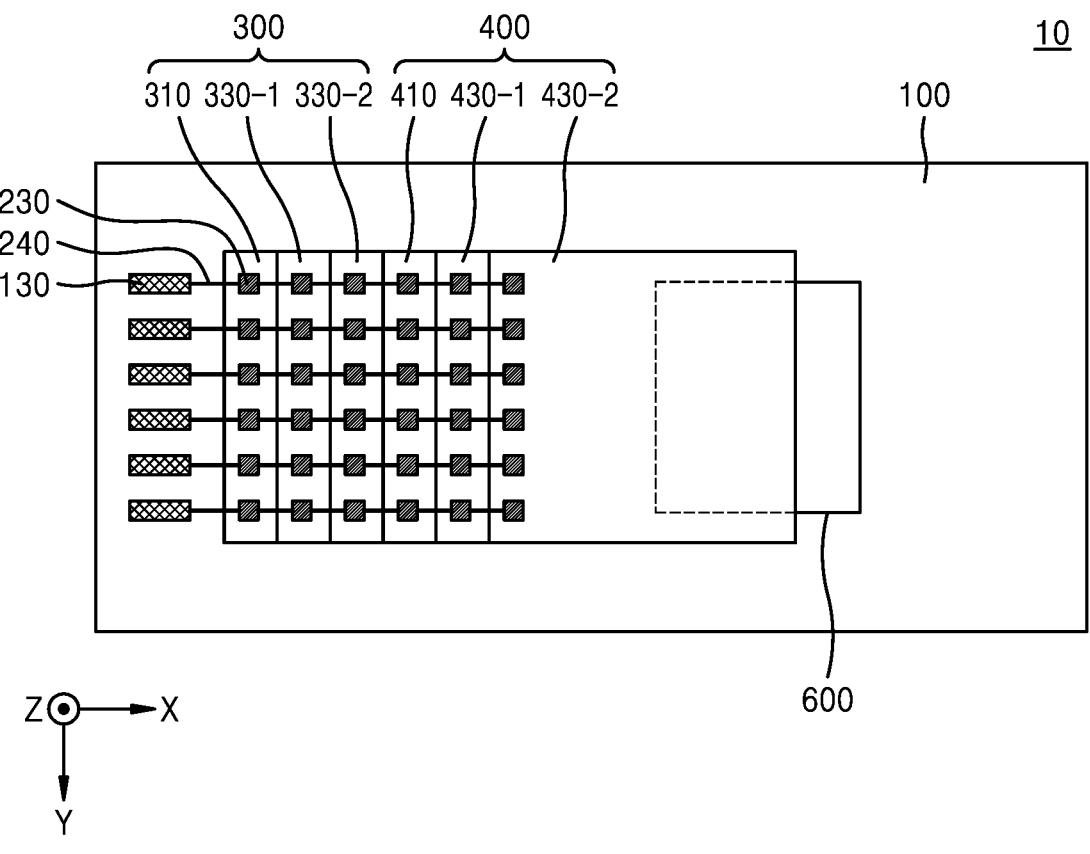
FIG. 1B is a plan view of the semiconductor package of FIG. 1A.

FIG. 1A is a cross-sectional view illustrating a semiconductor package according to an embodiment, and FIG. 1B is a plan view of the semiconductor package of FIG. 1A.

Referring to FIGS. 1A and 1B, the semiconductor package 10 according to the embodiment of the inventive concept may include a package substrate 100, an external connection bump 110, a substrate pad 130, a chip stacked structure 200, a bonding pad 230, a bonding wire 240, and a first support 600.

The package substrate 100 may include a body part (not shown) and wiring (not shown). For example, the body part may be formed of insulating material(s), the wiring may be formed of conductive material(s). A part of the wiring may function as a bump pad on which the external connection bump 110 is mounted. For example, the package substrate 100 may be a printed circuit board (PCB). When the package substrate 100 is a PCB, the body part of the package substrate 100 may be formed in a thin shape by compressing high molecular materials (e.g., polymers) such as thermosetting resin, epoxy resin such as Flame Retardant 4 (FR-4), Bismaleimide Triazine (BT), Ajinomoto Build up Film (ABF), or phenol resin to a certain thickness, and after coating a copper foil on the surface of the body part, the wiring, which is an electrical signal transmission path, may be formed through patterning of the copper foil.

The external connection bump 110 may be disposed on the lower surface of the package substrate 100. The external connection bump 110 may be electrically connected to the wiring of the package substrate 100 through the bump pad. The external connection bump 110 may be formed of or may be a solder ball. However, according to an embodiment, the external connection bump 110 may have a structure including a pillar and a solder. For example, the external connection bump 110 may be a pillar bump. The semiconductor package 10 of the present embodiment may be mounted on an external substrate such as an interposer or a base substrate through the external connection bump 110. The external connection bump 110 may include or be formed of at least one of copper (Cu), silver (Ag), gold (Au), and tin (Sb).

As used herein, components described as being "electrically connected" are configured such that an electrical signal can be transferred from one component to the other (although such electrical signal may be attenuated in strength as it transferred and may be selectively transferred).

The substrate pad 130 is disposed on the upper surface of the package substrate 100, and may be located on one side of the upper surface of the package substrate 100. According to embodiments, the substrate pad 130 may be located near the end of the package substrate 100 in the second direction. The substrate pad 130 may be electrically connected to the bonding pad 230 through the bonding wire 240. According to embodiments, a plurality of substrate pads 130 may be provided and disposed on the upper surface of the package substrate 100, and may be spaced apart from each other in the third direction. In the present specification, a singular form of constituent elements may also indicate that a plurality of the same elements are present unless the context clearly indicates otherwise.

The chip stacked structure 200 is disposed on the package substrate 100, and may include a first chip stacked structure 300 and a second chip stacked structure 400. According to embodiments, the chip stacked structure 200 may be a structure in which a plurality of chips are stacked offset in a first direction on the package substrate 100. For example, the chip stacked structure 200 may have a structure in which a plurality of chips are stacked in a cascade type, e.g., a step type, in the first direction. For example, side surfaces of the chips stacked in a vertical direction may not be in the same vertical plane but be in different vertical planes sequentially shifted in the first direction. For example, the offset stacked chips may have a structure stacked in a vertical direction and at the same time sequentially shifting in a horizontal direction. The shifting distances between two chips disposed at directly adjacent levels to each other may be substantially the same.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The stacked chips may be semiconductor chips. Each of the semiconductor chips may be a memory chip or a logic chip. In some embodiments, the memory chip may be a volatile memory chip such as a dynamic random access memory (DRAM) or a static random access memory (SRAM), or may be a non-volatile memory chip such as a phase-change random access memory (PRAM), a magnetoresistive random access memory (MRAM), a ferroelectric random access memory (FeRAM), or a resistive random access memory (RRAM). Also, in some embodiments, the logic chip may be a memory controller chip, a central processing unit (CPU) chip, a graphics processing unit (GPU) chip, or an application processor (AP) chip.

The first chip stacked structure 300 is disposed on the upper surface of the package substrate 100 and may include a first base chip 310 and first stacked chips 330-1 and 330-2.

The first base chip 310 may be positioned on the upper surface of the package substrate 100, and the first stacked chips 330-1 and 330-2 may be positioned on the first base chip 310, e.g., sequentially. According to embodiments, the first stacked chips 330-1 and 330-2 may be sequentially offset-stacked along the first direction on the upper surface of the first base chip 310. For example, the first stacked chips 330-1 and 330-2 may be stacked on the first base chip 310 in a cascade type, e.g., a step type, in the first direction.

The first base chip 310 may be adhered to and fixed on the upper surface of the package substrate 100 through an adhesive layer 210, the first stacked chip 330-1 may be adhered to and fixed on the upper surface of the first base chip 310 through an adhesive layer 210, and another first stacked chip 330-2 may be adhered to and fixed on the upper surface of the first stacked chip 330-1 through an adhesive layer 210.

The second chip stacked structure 400 is disposed on the upper surface of the first chip stacked structure 300 and may include a second base chip 410 and second stacked chips 430-1 and 430-2. The second base chip 410 may be positioned on the upper surface of the first chip stacked structure 300, and the second stacked chips 430-1 and 430-2 may be positioned on the second base chip 410.

According to embodiments, the second stacked chips 430-1 and 430-2 may be sequentially offset-stacked along the first direction on the upper surface of the second base chip 410. For example, the second stacked chips 430-1 and 430-2 may be stacked on the second base chip 410 in a cascade type, e.g., a step type, in the first direction.

The second base chip 410 may be adhered to and fixed on the upper surface of the first chip stacked structure 300 through an adhesive layer 210, the second stacked chip 430-1 may be adhered to and fixed on the upper surface of the second base chip 410 through an adhesive layer, and another second stacked chip 430-2 may be adhered to and fixed on the upper surface of the second stacked chip 430-1 through an adhesive layer.

In the semiconductor package 10 of this embodiment illustrated in FIG. 1A, the first and second chip stacked structures 300 and 400 each includes three chips, but the number of chips of the first and second chip stacked structures 300 and 400 is not limited to three. For example, the first and second chip stacked structures 300 and 400 may each include two, or four or more chips, and the number of chips of the first and second chip stacked structures 300 and 400 may be different from each other in certain embodiments.

The second base chip 410 may be a criterion for distinguishing the first chip stacked structure 300 from the second chip stacked structure 400. The second base chip 410 may be relatively determined according to a relative position of the first base chip 310 among chips stacked on the package substrate 100. Criteria for determining the second base chip 410 will be described later with reference to FIG. 1C.

In relation to the chip stacked structure 200, according to the stacking method of the cascade type, exposure regions 220 of upper surfaces, each exposing a portion of each upper surface of the first base chip 310, the first stacked chips 330-1 and 330-2, the second base chip 410, and the second stacked chips 430-1 and 430-2, may be provided. For example, the exposure regions 220 may be regions of upper surfaces each of which is exposed upwards in each of the first base chip 310, the first stacked chips 330-1 and 330-2, the second base chip 410, and the second stacked chips 430-1 and 430-2. The exposure regions 220 may be respective end regions of the upper surfaces of the chips in the first direction. For example, each of the chips included in the chip stacked structure 200 has an exposure region, and the exposure region of an individual chip may be defined as a region not covered by other individual chips within the upper surface of the individual chip.

The bonding pad 230 may be disposed on an exposure region 220. According to embodiments, a plurality of bonding pads 230 may be provided and disposed on the exposure regions 220 spaced apart from each other along the third direction. For example, a plurality of bonding pads 230 may be disposed on each of the chips.

The bonding wire 240 may be formed on one side of the chip stacked structure 200. According to embodiments, the bonding wire 240 may electrically connect the bonding pads 230 on the exposure regions 220 to each other, and may electrically connect the substrate pad 130 to one or more of the bonding pads 230.

The first support 600 may be mounted on the upper surface of the package substrate 100. According to embodiments, the first support 600 may be mounted on the upper surface of the package substrate 100 to be spaced apart from the first chip stacked structure 300 in the first direction. The first support 600 may be configured to support the second chip stacked structure 400. According to embodiments, the first support 600 may support the lower surface of the second base chip 410 to support the second chip stacked structure 400.

According to embodiments, the first support 600 may be formed of dummy silicon. For example, the first support 600 may be a silicon pattern. In certain embodiments, the dummy silicon may be a silicon chip including no active devices. For example, the dummy silicon may include inactive conductor patterns and/or semiconductor patterns within the dummy silicon. The lower surface and a lower portion of the second base chip 410 in contact with the first support 600 may be made of silicon, and when the first support 600 is made of dummy silicon (e.g., silicon), the first support 600 may have the same physical properties as or similar physical properties to the second base chip 410. The dummy silicon may be silicon, and a pattern formed of dummy silicon may be a pattern without other material patterns (e.g., metal/conductor patterns) included inside of the silicon pattern. Accordingly, since the coefficients of thermal expansion of the first support 600 and the second base chip 410 are the same or similar, coefficients of thermal expansion (CTE) of the first support 600 and the second base chip 410 may be the same and may not mismatch.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Other words used to describe the relationship between elements should be interpreted in a like fashion (e.g., "between" versus "directly between," "adjacent" versus "directly adjacent," "lower" versus "directly lower," "upper" versus "directly upper," etc.).

According to embodiments, the first support 600 may be formed of or may be a semiconductor chip. The semiconductor chip may be a controller chip, a frequency boosting interface (FBI) chip, or a dynamic random access memory (D-RAM) chip. A detailed description about the semiconductor chip support 600 will be described later with reference to FIGS. 4 to 6.

Figure 1C:
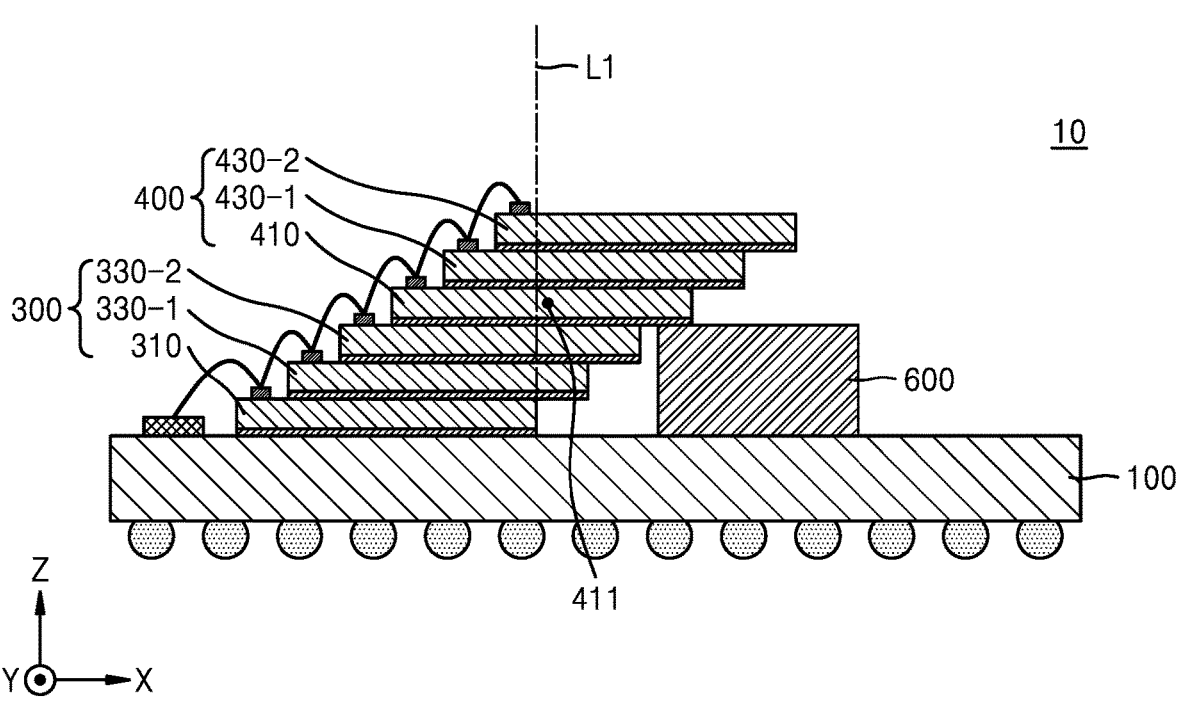
FIG. 1C is a cross-sectional view for explaining a position of a first support of the semiconductor package of FIG. 1A.

FIG. 1C is a cross-sectional view for explaining the position of the first support 600 of the semiconductor package 10 of FIG. 1A.

Referring to FIG. 1C, the semiconductor package 10 may include a package substrate 100, first and second chip stacked structures 300 and 400, and a first support 600. The first chip stacked structure 300 may include a first base chip 310 and first stacked chips 330-1 and 330-2, and the second chip stacked structure 400 may include a second base chip 410 and second stacked chips 430-1 and 430-2.

The first support 600 is spaced apart from the first chip stacked structure 300 in the first direction, and supports the second chip stacked structure 400 by supporting an end portion of the lower surface of the second base chip 410 in the first direction.

The first imaginary line L1 may be a line extending in the Z-axis direction on a plane in which a side surface of the first base chip 310 positioned at an end of the first base chip 310 in the first direction is placed. For example, the first imaginary line L1 may be a line extending in a direction perpendicular to the upper surface of the package substrate 100 at the right (X-axis direction) end of the first base chip 310 or may be a straight line extending in a direction (Z-axis direction) parallel to the side surface of the first base chip 310 at the right (X-axis direction) end of the first base chip 310.

The second base chip 410 may be a stacked chip positioned at the lowermost level/position/end among the stacked chips of which center is positioned on the side in the first direction (e.g., at the right-hand side) from the first imaginary line L1. For example, the second base chip 410 may be a chip located at the lowermost position/end while the center of the chip is located to the right of the first imaginary line L1 among the chips stacked on the package substrate 100.

The second base chip 410 may be a criterion for distinguishing the first chip stacked structure 300 from the second chip stacked structure 400. Based on the second base chip 410, the first chip stacked structure 300 may include or be formed of chips stacked/positioned under the second base chip 410, and the second chip stacked structure 400 may include or be formed of the second base chip 410 and chips stacked on/above the second base chip 410.

The position of the second base chip 410 will be described in more detail below.

The chips stacked on the package substrate 100 may include or may be chips offset-stacked in a cascade type, e.g., a step type, in the first direction. In the offset stacking chips, the centers of the chips may be positioned in/along the first direction, e.g., in a plan view. A center of each chip may be positioned farther on the right (e.g., in the first direction) than a center of a chip positioned immediately below the chip due to the cascade type stacking. Conversely, the center of each chip may be located in/along the second direction. A center of each chip may be positioned farther on the left (e.g., in the second direction) than a center of an offset-stacked chip positioned immediately above the chip.

In the semiconductor package 10 of the inventive concept, among the chips stacked in the cascade type on the package substrate 100, a chip located at the lowermost end among the chips whose centers are located on/at the right-hand side with respect to or from the first imaginary line L1 may be specified as the second base chip 410. When the second base chip 410 is specified, among the chips stacked on the package substrate 100, chips offset-stacked along the first direction on/above the upper surface of the second base chip 410 may be specified as second stacked chips 430-1 and 430-2, and a set of the second base chip 410 and the second stacked chips 430-1 and 430-2 may be a second chip stacked structure 400. For example, each chip of the second chip stacked structure 400 may have a center which does not vertically overlap the first base chip 310.

In addition, as the second base chip 410 is specified, the chip located just below the second base chip 410 may be the first stacked chip 330-2 located at the uppermost level/position/end of the first chip stacked structure 300, and a set of stacked chips from the first base chip 310 to the first stacked chip 330-2 may be the first chip stacked structure 300.

As a result, the first support 600 may support the second chip stacked structure 400 by supporting the second base chip 410, e.g., the chip located at the lowermost level/position/end among the chips whose centers are located farther on the right than the right end of the first base chip 310.

Figure 2:
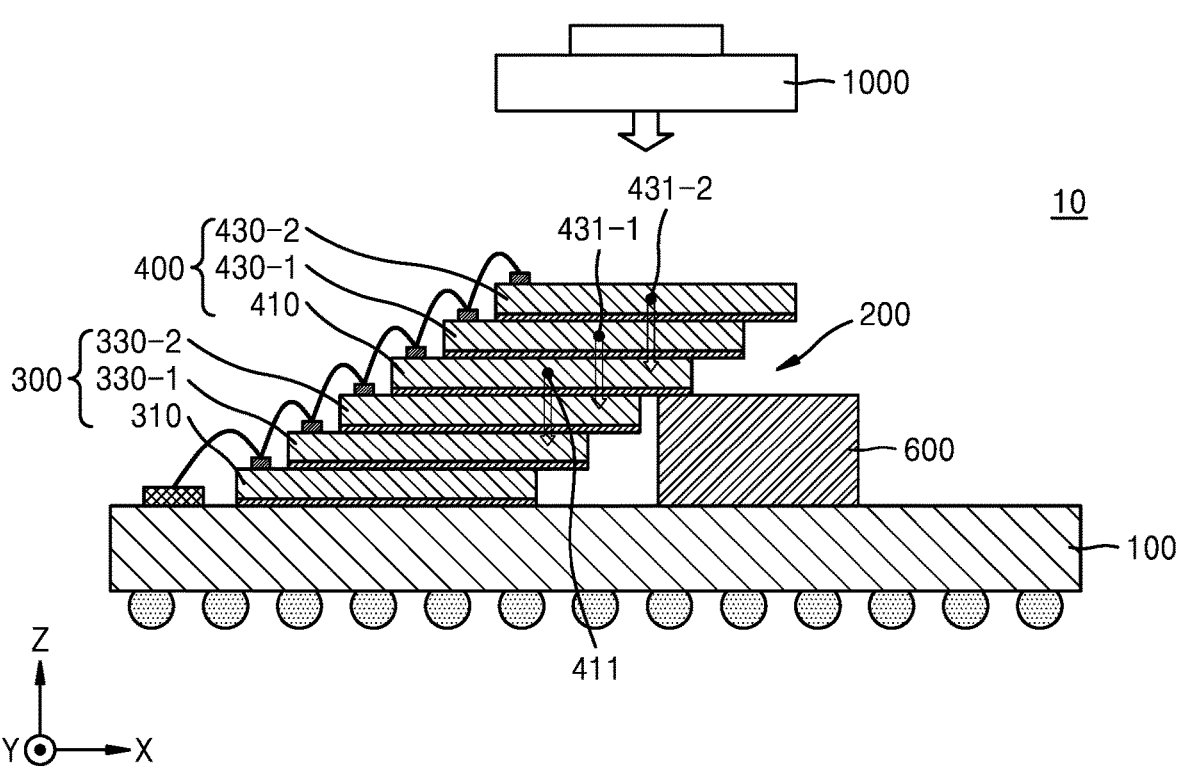
FIG. 2 is a cross-sectional view for explaining an effect of a semiconductor package according to an embodiment.

FIG. 2 is a cross-sectional view for explaining an effect of a semiconductor package according to an embodiment.

Referring to FIG. 2, the semiconductor package 10 may include a first chip stacked structure 300, a second chip stacked structure 400, and a first support 600. By cascade-type stacking of the first and second chip stacked structures 300 and 400 in the first direction, as the second base chip 410 and the second stacked chips 430-1 and 430-2 constituting the second chip stacked structure 400 are stacked, centers of the chips may be gradually positioned to the right (e.g., gradually shifting to the right). Accordingly, each of the second base chip 410 and the second stacked chips 430-1 and 430-2 may have a center of the chip located on/at the right-hand side with respect to or from the end of the first base chip 310 in the first direction (e.g., the right-hand side end).

The load (e.g., gravity) of the chip may act or may be applied downwardly in a direction from the center of the chip toward the upper surface of the package substrate 100. For example, gravity or gravitational forces of the chips may be applied downwardly, e.g., from centers of the chips toward the package substrate 100. Therefore, the load/gravity of the second base chip 410 acts or is applied downwardly as indicated by an arrow at the center 411 of the second base chip, and the loads (e.g., gravity or gravitational forces) of the second stacked chips 430-1 and 430-2 act or are applied in a downward direction as indicated by arrows at the centers 431-1 and 431-2 of the second stacked chips.

Since the centers of the second base chip 410 and the second stacked chips 430-1 and 430-2 are all located on/at the right-hand side with respect to or from the right end of the first base chip 310, loads/gravity of the second base chip 410 and the second stacked chips 430-1 and 430-2 may also act on or be applied to the right-hand side from the right end of the first base chip 310. Accordingly, a phenomenon in which the load is concentrated on the right end of the first base chip 310 may occur without the first support 600. In addition, a clockwise moment may be applied to the right end of the first base chip 310 by the loads in case the first support is not formed thereby not supporting the stacked chips.

As a result, due to the cascade-type stacking structure of which chips are gradually shifting in the first direction from the first base chip 310 to the uppermost second stacked chip 430-2, a load and moment concentration may occur at the right end of the first base chip 310 in case the first support 600 does not support the stacked chips. However, while the first support 600 supports the second chip stacked structure 400, a vertical drag force (e.g., reaction force) is generated on the upper surface of the first support 600, and since the vertical drag/reaction force is applied in a direction opposite to the load of the second base chip 410 and the second stacked chips 430-1 and 430-2, the load (gravity or gravitational force) applied to the right end of the first base chip 310 may be dispersed/distributed/dissipated. In addition, since a counterclockwise moment is applied to the right end of the first base chip 310 by the vertical drag/reaction force, the clockwise moment applied to the right end of the first base chip 310 may be offset/dissipated.

In the case of a general semiconductor package, since the position of the support is not properly limited, the load of the chip stacked structure 200 was not efficiently distributed/dispersed/dissipated, and since the moment applied to the right end of the first base chip 310 is also not effectively offset, the semiconductor package was frequently defective.

However, in the semiconductor package 10 of the inventive concept, the first support 600 may support the lower end of the second base chip 410. The second base chip 410 may be a chip located at the lowermost end of the stacked chips that apply a clockwise moment to the right end of the first base chip 310 by the cascade stacking type. Therefore, when the first support 600 supports the lower end of the second base chip 410, since the first support 600 supports all the chips applying a clockwise moment to the right end of the first base chip 310, while distributing/dispersing the load (gravity or gravitational force) generated by the second base chip 410 and the second stacked chips 430-1 and 430-2 and applied downwardly toward the first support 600, the clockwise moment applied to the right end of the first base chip 310 may be offset/dissipated most efficiently.

As a result, in terms of load/gravity distribution/dispersion of the chip stacked structure 200, in the semiconductor package 10 according to embodiments of the inventive concept, as the first support 600 supports the lower end of the second base chip 410, the embodiment is beneficial to prevent a crack from occurring at the right end of the first base chip 310. For example, crack defects of the first base chip 310 will be improved.

In addition, a die attaching process may be performed on the semiconductor package. The die attaching process may press the upper surface of the chip stacked structure 200 with a die attaching apparatus 1000. Accordingly, an external force acts on (e.g., is applied to) the upper surface of the chip stacked structure 200 as indicated by an arrow in FIG. 2 and the external force is applied in the same direction as the load (gravity or gravitational force) of the chip stacked structure 200, so that the load and moment may be concentrated on the right end of the first base chip 310 by the same mechanism as the load/gravity of the second base chip 410 and the second stacked chips 430-1 and 430-2 is concentrated at the right end of the first base chip 310.

However, in the semiconductor package 10 according to the embodiments of the inventive concept, as the first support 600 supports the lower end of the second base chip 410, similarly to effectively offsetting the load and moment applied to the right end of the first base chip 310, even during the die attaching process, the first support 600 may effectively offset the load and moment applied to the right end of the first base chip 310 by the same mechanism.

After all, even during the die attaching process, in the semiconductor package 10 according to embodiments of the inventive concept, as the first support 600 supports the lower end of the second base chip 410, the embodiments may prevent a crack from occurring at the right end of the first base chip 310.

In addition, as the load and moment applied to the right end of the first base chip 310 is effectively offset/dissipated, in terms of action-reaction, a load and a moment applied to the vicinity of the first stacked chip 330-1 in contact with the first base chip 310 may also be effectively offset/dissipated.

As the semiconductor package 10 of the inventive concept appropriately limits the position of the first support 600, the semiconductor package 10 may to efficiently prevent cracking of chips stacked on the package substrate 100 and provide a reliable semiconductor package.

Figure 3A:
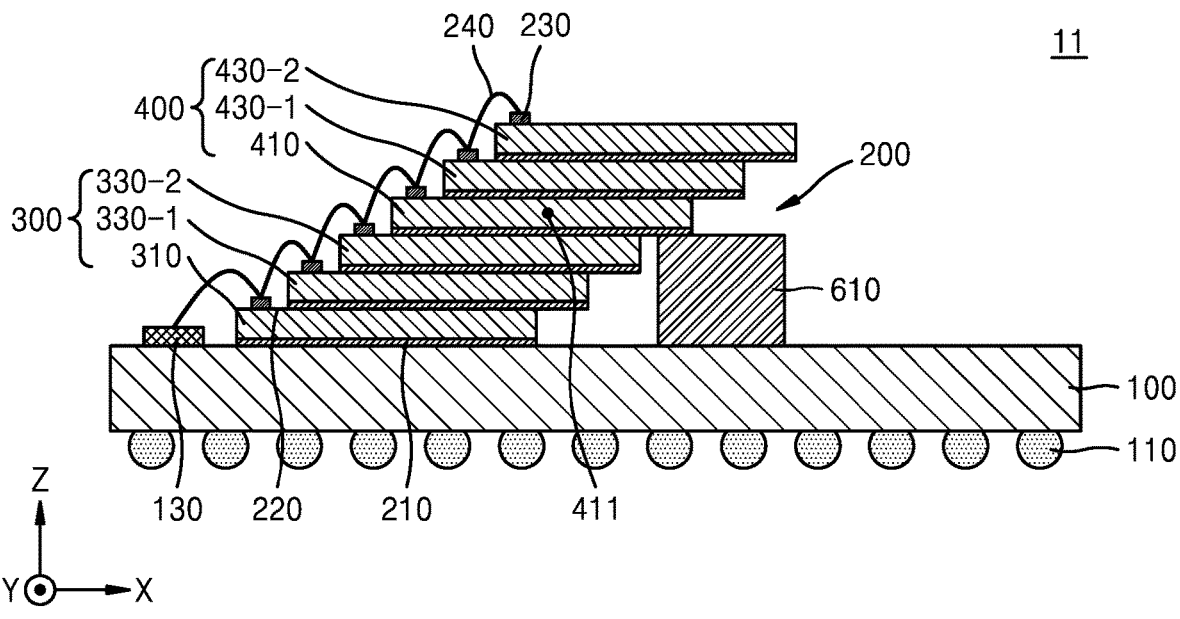
FIG. 3A is a cross-sectional view illustrating a semiconductor package according to an embodiment.
Figure 3B:
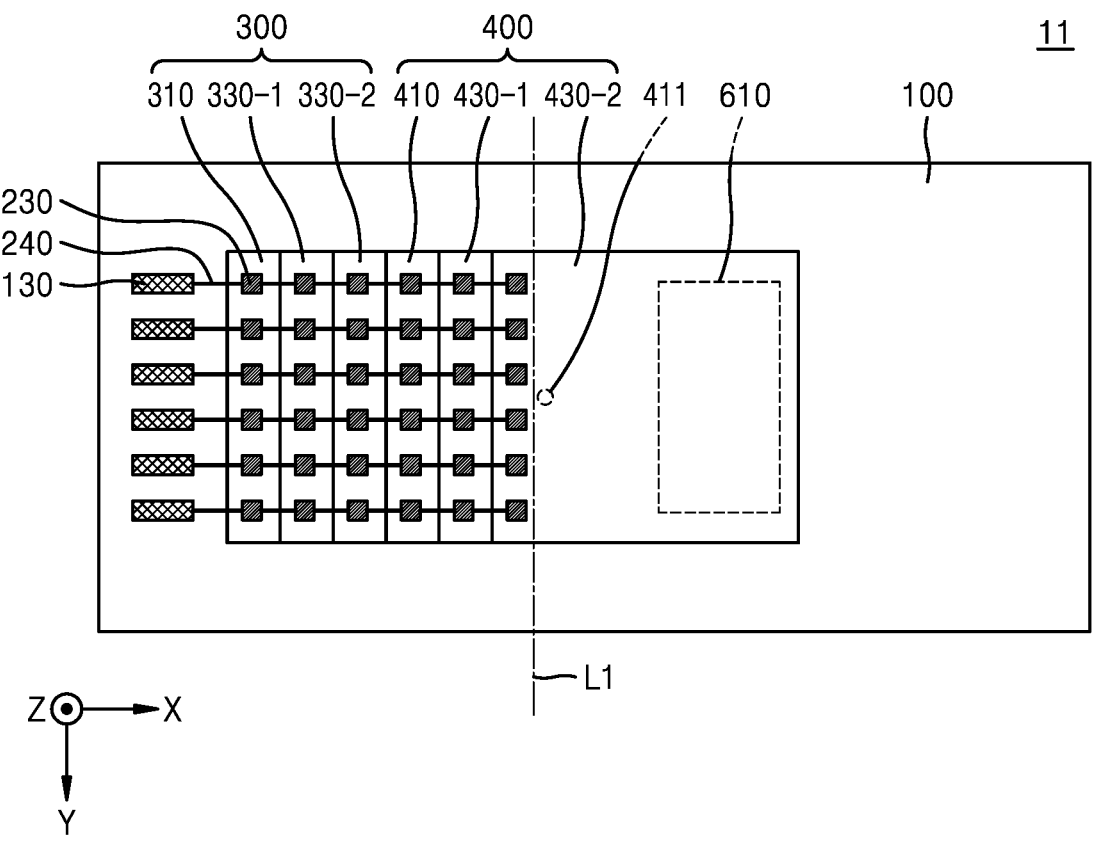
FIG. 3B is a plan view of the semiconductor package of FIG. 3A.

FIG. 3A is a cross-sectional view of a semiconductor package 11 according to an embodiment, and FIG. 3B is a plan view of the semiconductor package of FIG. 3A. Hereinafter, overlapping contents of the semiconductor package 10 of FIG. 1A and the semiconductor package 11 of FIG. 3A will be omitted, and differences will be mainly described.

Referring to FIGS. 3A and 3B, the semiconductor package 11 may include a package substrate 100, an external connection bump 110, a substrate pad 130, a chip stacked structure 200, a bonding pad 230, a bonding wire 240, and a first support 610 and the chip stacked structure 200 may include a first chip stacked structure 300 and a second chip stacked structure 400.

Right-hand side end of the first support 610 may be on the second direction side (at the left-hand side) from a right-hand side end of the second stacked chip 430-2 when the first support 610 is at the right-hand side from the first base chip 310. For example, the right end of the second stacked chip 430-2 positioned at the uppermost level/end of the second chip stacked structure 400 may be on the right-hand side from the right end of the first support 610.

Accordingly, the first support 610 may not be seen from above as the first support 610 is completely covered by the second chip stacked structure 400. For example, the second chip stacked structure 400 may completely overlap the first support 610 in a vertical direction.

When the first direction end (right end) of the first support 610 is located on the left-hand side from the first direction end (right end) of the second stacked chip 430-2 positioned at the uppermost level/end of the second chip stacked structure, e.g., when the first support 610 is completely covered by the second chip stacked structure 400, the internal space of the semiconductor package 11 may be reduced, and a compact semiconductor package may be provided.

Figure 4:
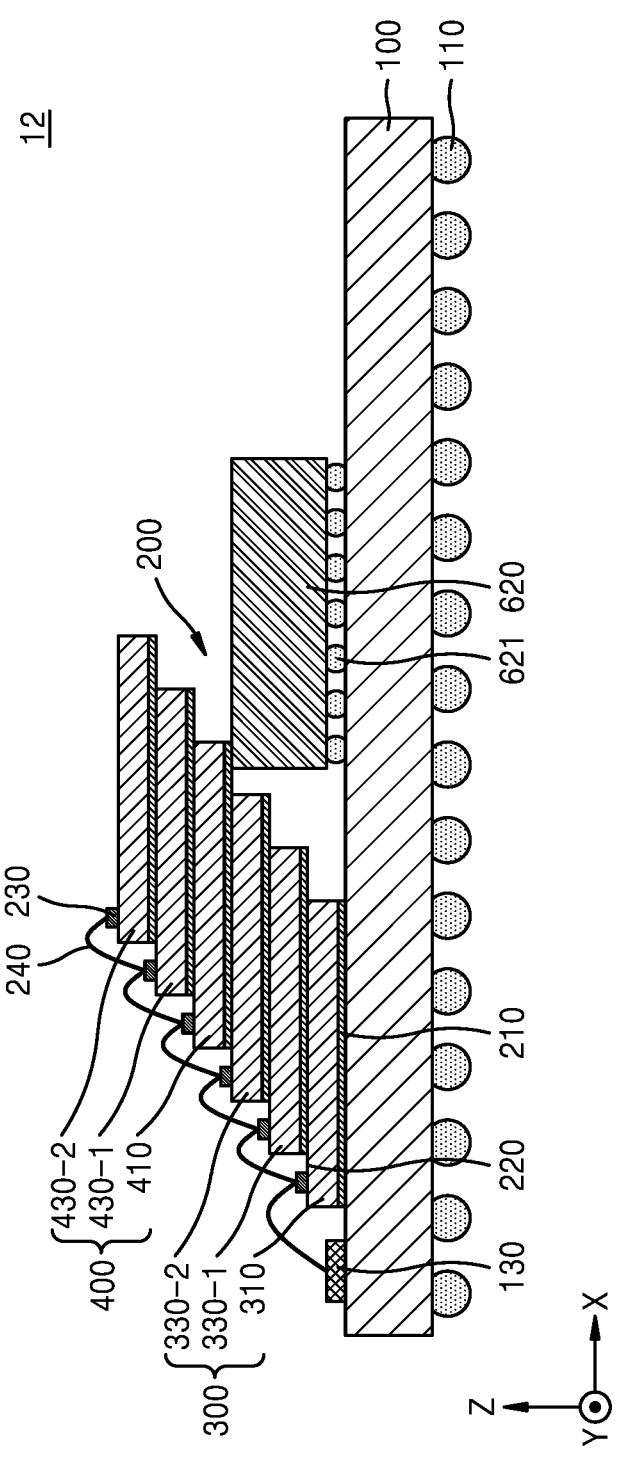
FIG. 4 is a cross-sectional view illustrating a semiconductor package according to an embodiment.

FIG. 4 is a cross-sectional view illustrating a semiconductor package 12 according to an embodiment. Hereinafter, overlapping contents of the semiconductor package 10 of FIG. 1A and the semiconductor package 12 of FIG. 4 will be omitted, and differences will be mainly described.

Referring to FIG. 4, the semiconductor package 12 may include a package substrate 100, an external connection bump 110, a substrate pad 130, a chip stacked structure 200, a bonding pad 230, a bonding wire 240, a first support 620, and a connection bump 621, and the chip stacked structure 200 may include a first chip stacked structure 300 and a second chip stacked structure 400.

According to embodiments, the first support 620 is a semiconductor chip, and may be a controller chip, an FBI chip, or a D-RAM chip.

According to embodiments, the semiconductor package 12 uses a controller chip serving as a controller for the chips in the first and second chip stacked structures 300 and 400 as a first support 620, such that the size of the semiconductor package may be reduced.

According to embodiments, the semiconductor package 12 uses the FBI chip serving as an interface to change an input frequency and transmit the changed input frequency to each semiconductor chip as the first support 620, such that the size of the semiconductor package may be reduced.

According to embodiments, the semiconductor package 12 uses a D-RAM chip, which is a heterogeneous semiconductor device mounted together with the chip stacked structure 200, as the first support 620, such that the size of the semiconductor package may be reduced.

In this case, the first support 620 may be electrically connected to the package substrate 100 through the connection bump 621. The first support 620 may be electrically connected to the first and second chip stacked structures 300 and 400 through the package substrate 100 and bonding wires 240.

Spatially relative terms, such as "beneath," "below," "lower," "above," "upper," "top," "bottom" and the like, may be used herein for ease of description to describe positional relationships. It will be understood that the spatially relative terms encompass different orientations of the device in addition to the orientation depicted in the figures.

Figure 5:
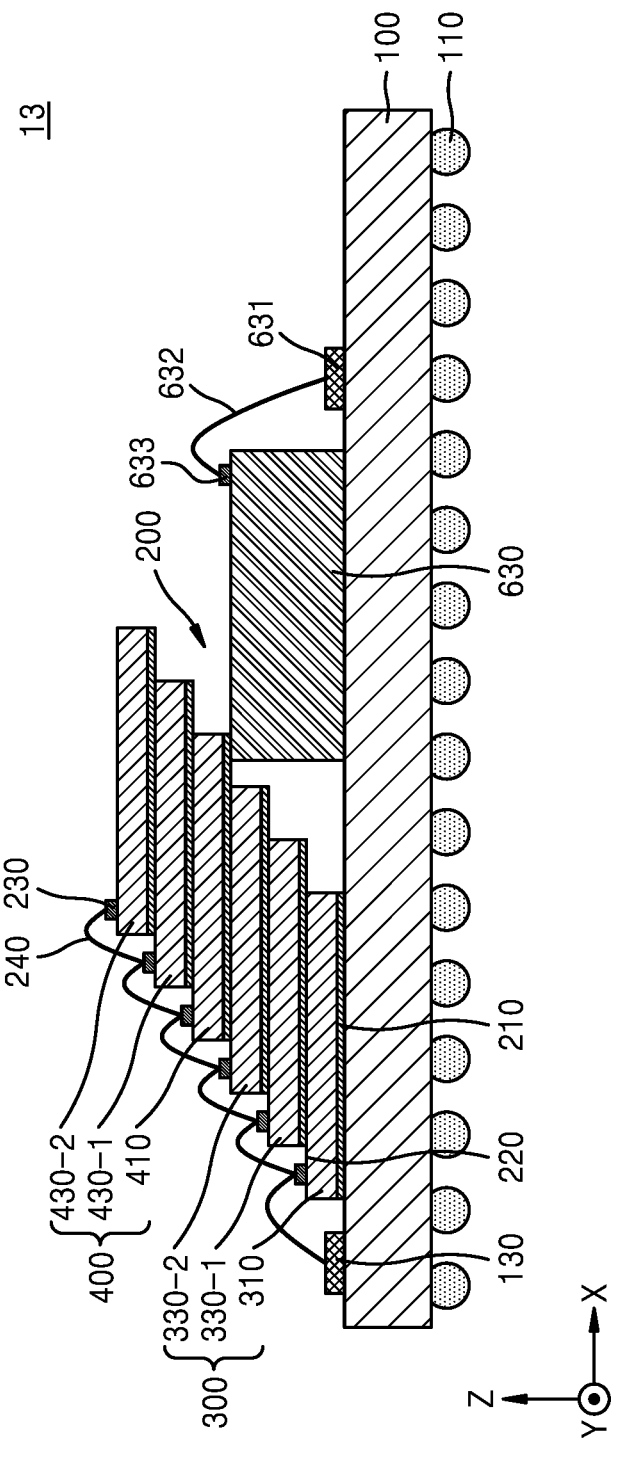
FIG. 5 is a cross-sectional view illustrating a semiconductor package according to an embodiment.

FIG. 5 is a cross-sectional view illustrating a semiconductor package 13 according to an embodiment. Hereinafter, overlapping contents of the semiconductor package 12 of FIG. 4 and the semiconductor package 13 of FIG. 5 will be omitted, and differences will be mainly described.

Referring to FIG. 5, the semiconductor package 13 includes a package substrate 100, an external connection bump 110, a substrate pad 130, a chip stacked structure 200, a bonding pad 230, a bonding wire 240, a first support 630, a substrate pad 631, a bonding wire 632, and a bonding pad 633, and the chip stacked structure 200 may include a first chip stacked structure 300 and a second chip stacked structure 400.

According to embodiments, the first support 630 is a semiconductor chip, and may be a controller chip, an FBI chip, or a D-RAM chip.

In this case, the first support 630 may be electrically connected to the package substrate 100 through the bonding pad 633, the bonding wire 632, and the substrate pad 631.

Figure 6:
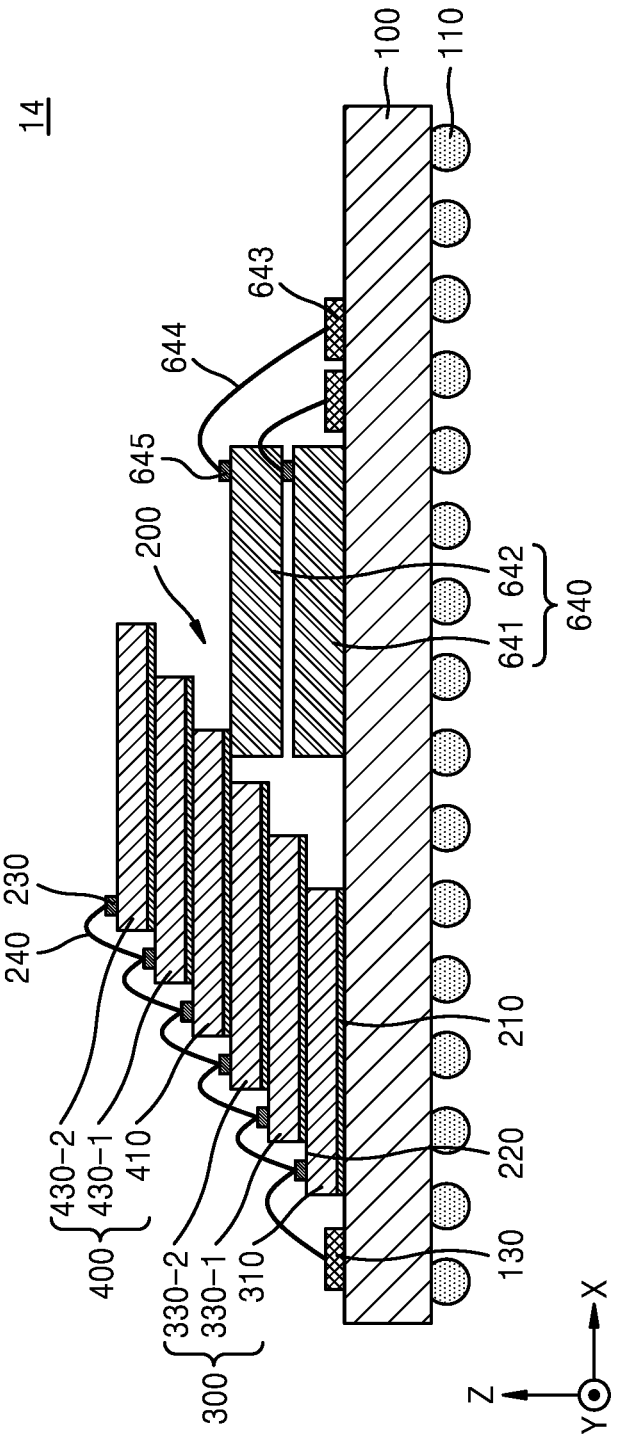
FIG. 6 is a cross-sectional view illustrating a semiconductor package according to an embodiment.

FIG. 6 is a cross-sectional view illustrating a semiconductor package 14 according to an embodiment. Hereinafter, overlapping contents of the semiconductor package 13 of FIG. 5 and the semiconductor package 14 of FIG. 6 will be omitted, and differences will be mainly described.

Referring to FIG. 6, the semiconductor package 14 may include a package substrate 100, an external connection bump 110, a substrate pad 130, a chip stacked structure 200, a bonding pad 230, a bonding wire 240, a first support 640, a substrate pad 643, a bonding wire 644, and a bonding pad 645. The chip stacked structure 200 may include a first chip stacked structure 300 and a second chip stacked structure 400.

According to embodiments, the first support 640 may include a first semiconductor chip 641 and a second semiconductor chip 642. The second semiconductor chip 642 may be positioned on an upper surface of the first semiconductor chip 641.

According to embodiments, the first semiconductor chip 641 may be a controller chip, an FBI chip, or a D-RAM chip. The second semiconductor chip 642 may be a controller chip, an FBI chip, or a D-RAM chip.

In the semiconductor package 14 of the present embodiment, the first support 640 includes two semiconductor chips, but the number of semiconductor chips of the first support 640 is not limited to two. For example, the first support 640 may include three or more chips.

According to embodiments, a plurality of substrate pads 643, bonding wires 644, and bonding pads 645 may be provided respectively corresponding to the number of semiconductor chips of the first support 640.

In this case, the first semiconductor chip 641 may be electrically connected to the package substrate 100 through the bonding pad 645, the bonding wire 644, and the substrate pad 643, and the second semiconductor chip 642 may be electrically connected to the package substrate 100 through a bonding pad 645, a bonding wire 644, and a substrate pad 643 corresponding to the second semiconductor chip 642. The first and second semiconductor chips 641 and 642 may be electrically connected to the first and second chip stacked structures 300 and 400 through the package substrate 100 and bonding wires 240.

According to embodiments, the semiconductor package 14 uses the first semiconductor chip 641 and the second semiconductor chip 642 stacked/disposed on the first semiconductor chip 641 as a first support 640 such that the embodiments are beneficial to reduce the size of the semiconductor package.

Figure 7:
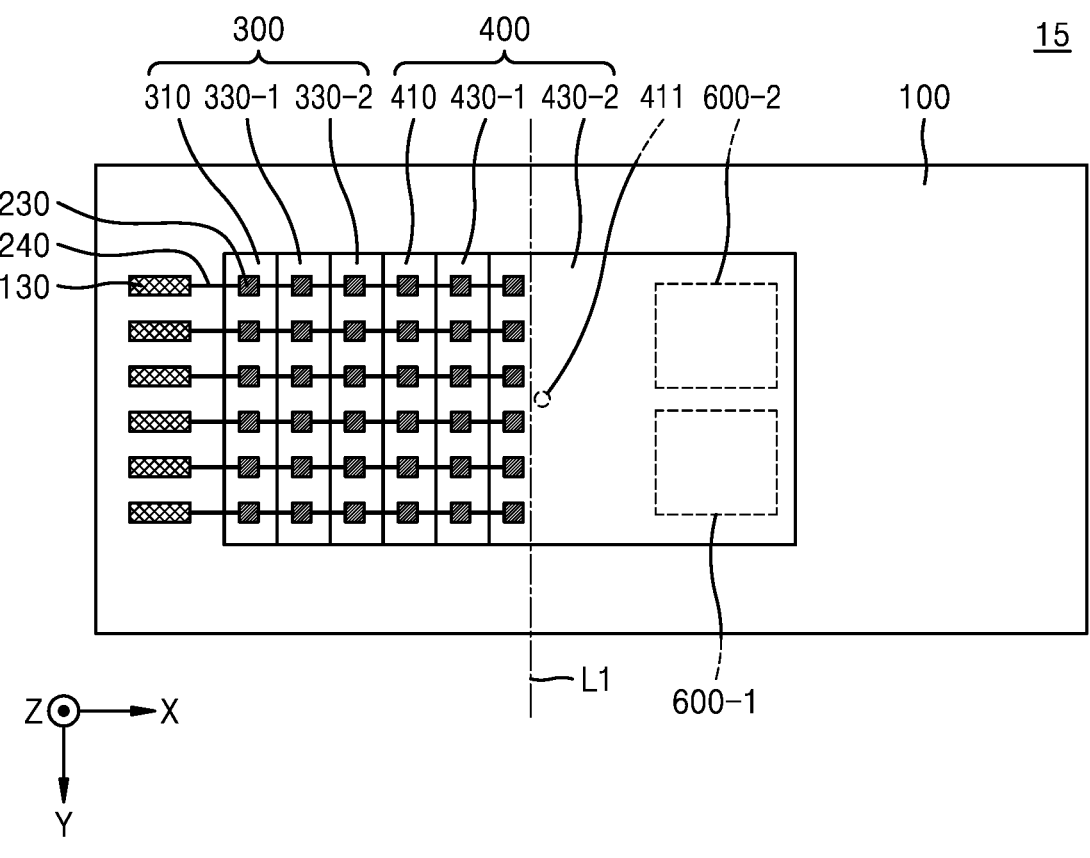
FIG. 7 is a plan view illustrating a semiconductor package according to an embodiment.

FIG. 7 is a plan view illustrating a semiconductor package 15 according to an embodiment. Hereinafter, overlapping contents of the semiconductor package 10 of FIG. 1A and the semiconductor package 15 of FIG. 7 will be omitted, and differences will be mainly described.

Referring to FIG. 7, the semiconductor package 15 may include a package substrate 100, an external connection bump 110, a substrate pad 130, a first chip stacked structure 300, a second chip stacked structure 400, a bonding pad 230, a bonding wire 240, and a plurality of first supports 600-1 and 600-2.

While being spaced apart from each other in the third direction and positioned on the upper surface of the package substrate 100, the plurality of first supports 600-1 and 600-2 may support the lower surface of the second base chip 410 to support the second chip stacked structure 400.

According to embodiments, the plurality of first supports 600-1 and 600-2 are semiconductor chips, and each of which may be a controller chip, an FBI chip, or a D-RAM chip, and the plurality of first supports 600-1 and 600-2 may be different types of semiconductor chips from each other.

According to embodiments, the semiconductor package 15 supports the second chip stacked structure 400 with a plurality of first supports 600-1 and 600-2 composed of semiconductor chips, such that it is possible to reduce the size of the semiconductor package while properly disposing/arranging the semiconductor chips. While two first supports 600-1 and 600-2 are illustrated in FIG. 7, the embodiments are not limited thereto, and three or more first supports may be provided in certain embodiments.

Figure 8A:
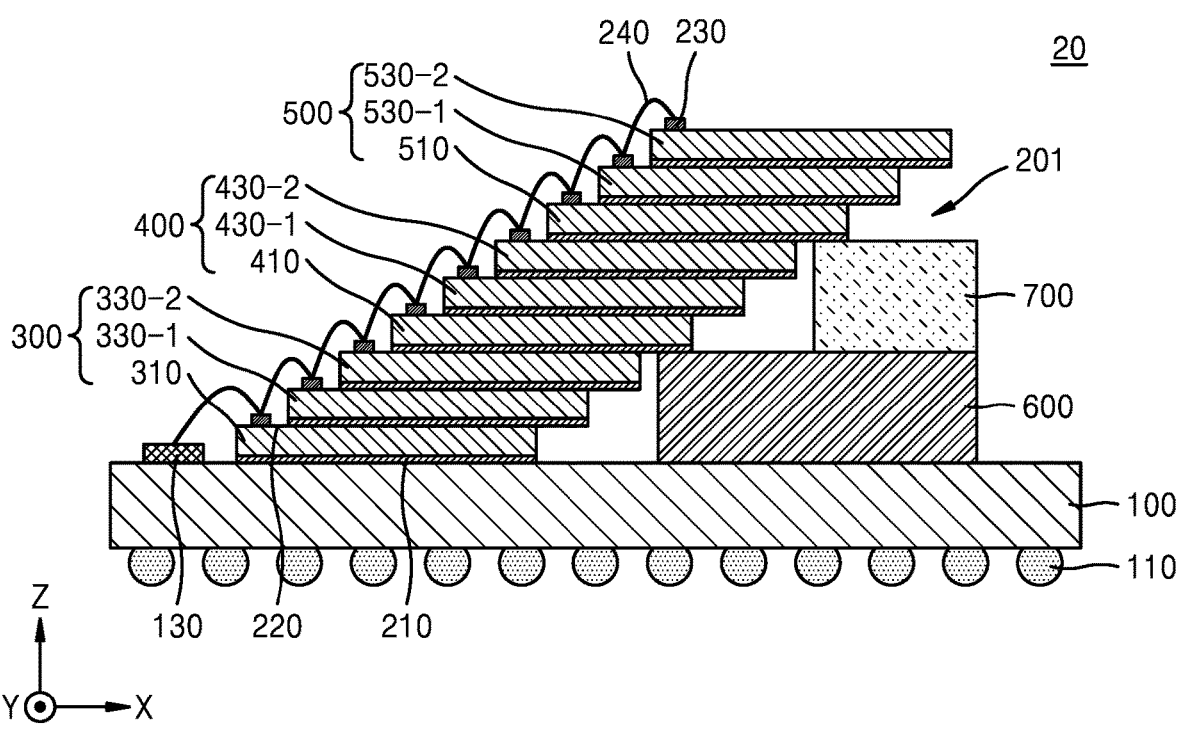
FIG. 8A is a cross-sectional view for explaining a semiconductor package according to an embodiment.
Figure 8B:
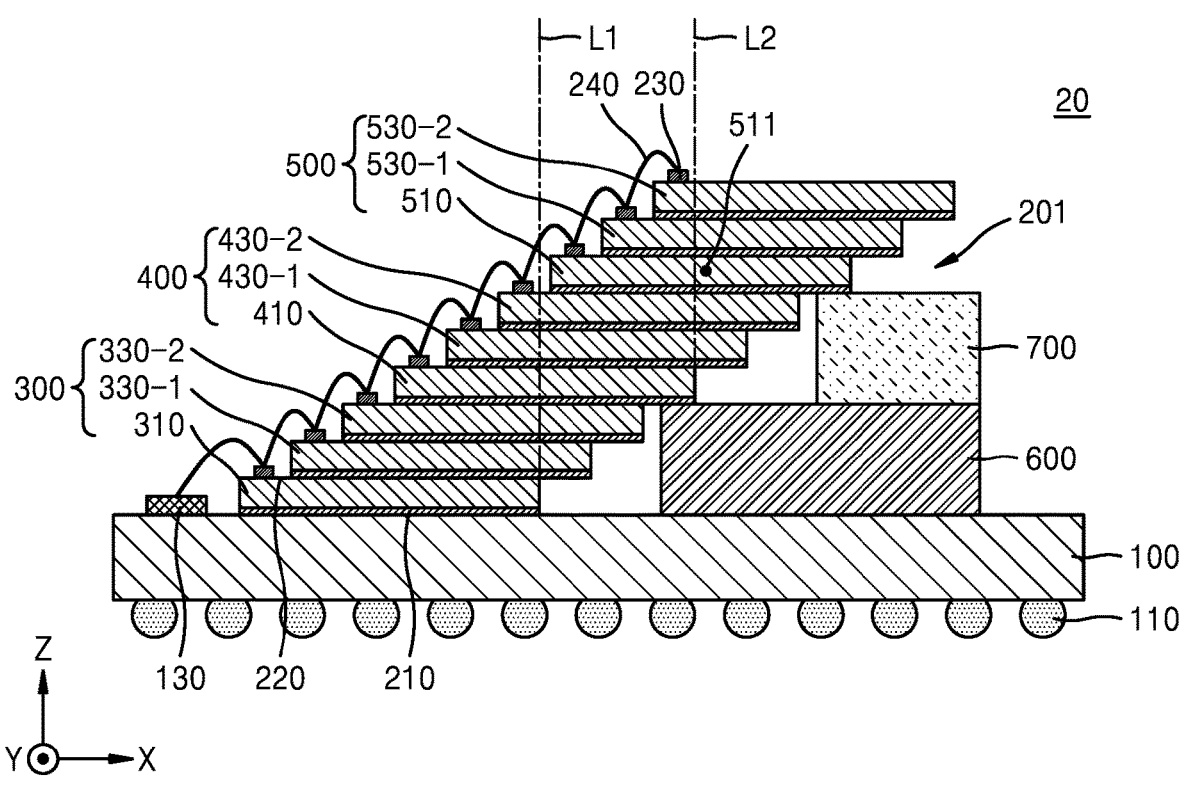
FIG. 8B is a cross-sectional view for explaining the positions of the first support and the second support of the semiconductor package of FIG. 8A.

FIG. 8A is a cross-sectional view for explaining a semiconductor package 20 according to an embodiment, and FIG. 8B is a cross-sectional view for explaining the positions of the first support 600 and the second support 700 of the semiconductor package 20 of FIG. 8A. Hereinafter, overlapping contents of the semiconductor package 10 of FIG. 1A and the semiconductor package of FIG. 8A will be omitted, and differences will be mainly described.

Referring to FIGS. 8A and 8B, the semiconductor package 20 may include a package substrate 100, an external connection bump 110, a substrate pad 130, a chip stacked structure 201, a bonding pad 230, a bonding wire 240, a first support 600, and a second support 700. The chip stacked structure 201 may include a first chip stacked structure 300, a second chip stacked structure 400, and a third chip stacked structure 500.

According to some embodiments, the first support 600 and the second support 700 may be formed of dummy silicon, e.g., a silicon pattern.

According to certain embodiments, the first support 600 and the second support 700 are semiconductor chips, and each of which may be a controller chip, an FBI chip, or a D-RAM chip, and the first support 600 and the second support 700 may be different types of semiconductor chips from each other. In certain embodiments, the plurality of first supports 600-1 and 600-2 of FIG. 7 may replace the first support 600 of FIGS. 8A and 8B, and the plurality of first supports 600-1 and 600-2 may be different types of semiconductor chips from each other.

In embodiments, the second support 700 may be positioned to be spaced apart from the first and second chip stacked structures 300 and 400 in the first direction on the upper surface of the first support 600. The second support 700 may support/contact a lower surface of the third base chip 510 to support the third chip stacked structure 500. In embodiments, the second support 700 may support the third chip stacked structure 500 by supporting/contacting an end portion of the lower surface of the third base chip 510 in the first direction.

The second imaginary line L2 may be a line extending in a vertical direction and disposed in a plane in which a side surface of the second base chip 410 in the first direction disposed. For example, the second imaginary line L2 may be a line extending perpendicularly to the upper surface of the package substrate 100 at the right (X-axis direction) end of the second base chip 410 in a cross-sectional view in which the first base chip 310 is positioned at the left-hand side from the first support 600 as shown in FIGS. 8A and 8B.

The third base chip 510 may be a stacked chip located at the lowermost level/end among stacked chips whose centers are positioned on the first direction side (right-hand side) with respect to or from the second imaginary line L2. For example, the third base chip 510 may be a chip located at the lowermost level/end while the center of the chip is located at the right-hand side from the second imaginary line L2 among the chips stacked on the package substrate 100, e.g., in a cross-sectional view in which the first base chip 310 is positioned at the left-hand side from the first support 600 as shown in FIGS. 8A and 8B.

The third base chip 510 may be a criterion for distinguishing the second chip stacked structure 400 from the third chip stacked structure 500. Based on the third base chip 510, the second chip stacked structure 400 may include chips stacked/placed on the first chip stacked structure 300 while being stacked/placed under the third base chip 510, and the third chip stacked structure 500 may include or be formed of a third base chip 510 and chips stacked on the third base chip 510.

The position of the third base chip 510 will be described in more detail below.

The chips stacked on the package substrate 100 may include chips offset-stacked in a cascade type, e.g., a step type, in the first direction. In the offset stacking chips, the center of a chip may be positioned in the first direction, e.g., on the right-hand side, from the center of a chip immediately below the chip due to the cascade type stacking. For example, the center of the chip at a lower level/end may be located in the second direction, e.g., on the left-hand side from a center of the chip that is offset-stacked directly at the upper level/end.

In the semiconductor package 20 of the inventive concept, among the chips stacked in the cascade type on the package substrate 100, a chip located at the lowermost level/end of the chips whose center is located on the right-hand side with respect to or from the second imaginary line L2 may be specified/classified as the third base chip 510. When the third base chip 510 is specified, among the chips stacked on the package substrate 100, chips offset-stacked along the first direction on the upper surface of the third base chip 510 may be specified/classified as third stacked chips 530-1 and 530-2, and a set of the third base chip 510 and the third stacked chips 530-1 and 530-2 may be a third chip stacked structure 500. For example, each chip of the third chip stacked structure 500 may have a center which does not vertically overlap the second base chip 410. The center of each chip in the third chip stacked structure 500 also does not vertically overlap the first base chip 310.

In addition, as the third base chip 510 is specified, the chip located just below the third base chip 510 may be the second stacked chip 430-2 located at the uppermost end of the second chip stacked structure 400, and referring to FIG. 1C, a set of stacked chips from the second base chip 410 to the second stacked chip 430-2 may become the second chip stacked structure 400. The first base chip 310, the first stacked chips 330-1 and 330-2 and the first chip stacked structure 300 may be substantially the same as or similar to those specified in FIGS. 1A to 1C, and detailed descriptions thereof will be omitted.

As a result, the second support 700 may support the third chip stacked structure 500 by supporting/contacting the third base chip 510, e.g., the chip located at the lowermost end among the chips whose centers are located on/at the right-hand side from the right end of the second base chip 510.

Even if the chip stacked structure 201 stacked in the cascade type is elongated in the first direction, as the semiconductor package 20 of the inventive concept is provided with a first support 600 and a second support 700, it is possible to efficiently distribute/disperse/dissipate the load of the chip stacked structure 201 and effectively offset/dissipate the moment applied to the stacked chips.

For example, as the semiconductor package 20 of the inventive concept appropriately limits the positions of the first support 600 and the second support 700, the embodiments of FIGS. 8A and 8B may to efficiently prevent cracking of chips stacked on the package substrate 100 and provide a reliable semiconductor package.

Figure 9:
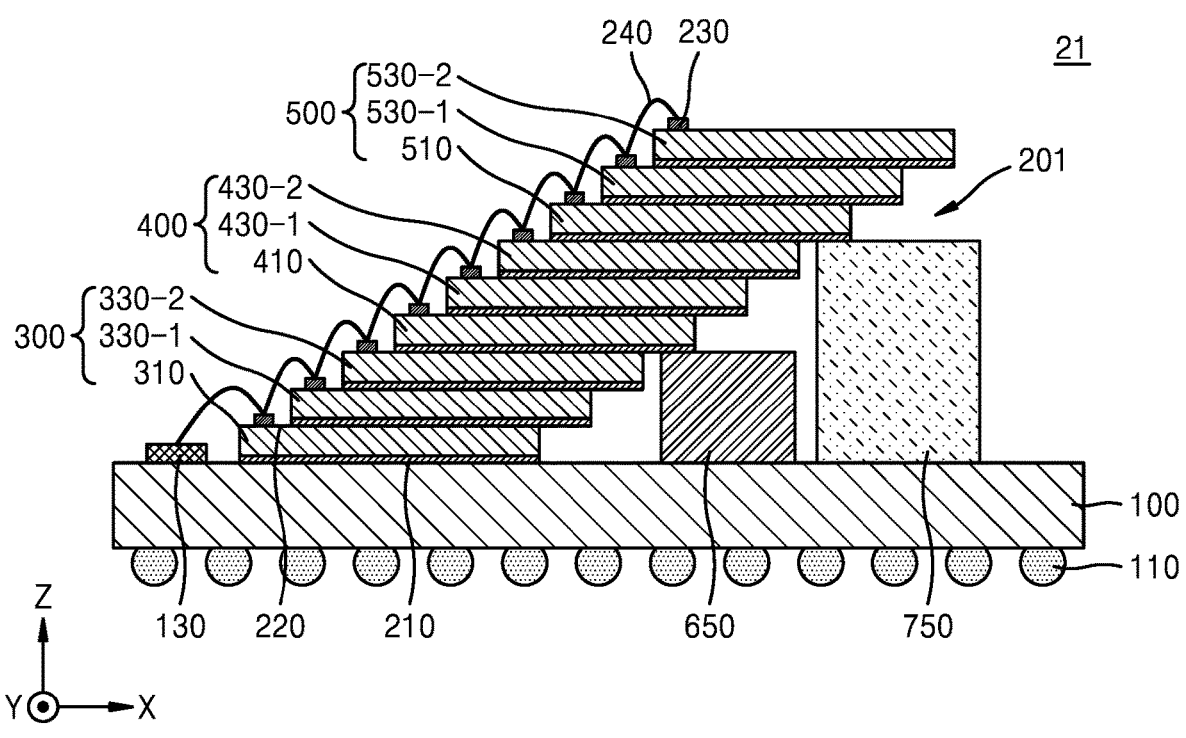
FIG. 9 is a cross-sectional view illustrating a semiconductor package according to an embodiment.

FIG. 9 is a cross-sectional view illustrating a semiconductor package 21 according to an embodiment. Hereinafter, overlapping contents of the semiconductor package 10 of FIG. 1A and the semiconductor package 21 of FIG. 9 will be omitted, and differences will be mainly described.

Referring to FIG. 9, the semiconductor package 21 may include a package substrate 100, an external connection bump 110, a substrate pad 130, a chip stacked structure 201, a bonding pad 230, a bonding wire 240, a first support 650, and a second support 750. The chip stacked structure 201 may include a first chip stacked structure 300, a second chip stacked structure 400, and a third chip stacked structure 500.

In embodiments, the second support 750 is spaced apart from the first support 650 in the first direction, e.g., to the right, and is located on the upper surface of the package substrate 100, and may be spaced apart from the first and second chip stacked structures 300 and 400 in the first direction. The second support 750 may support the lower surface of the third base chip 510 to support the third chip stacked structure 500. In embodiments, the second support 700 may support the third chip stacked structure 500 by supporting an end portion of a lower surface of the third base chip 510 in the first direction.

Figure 10A:
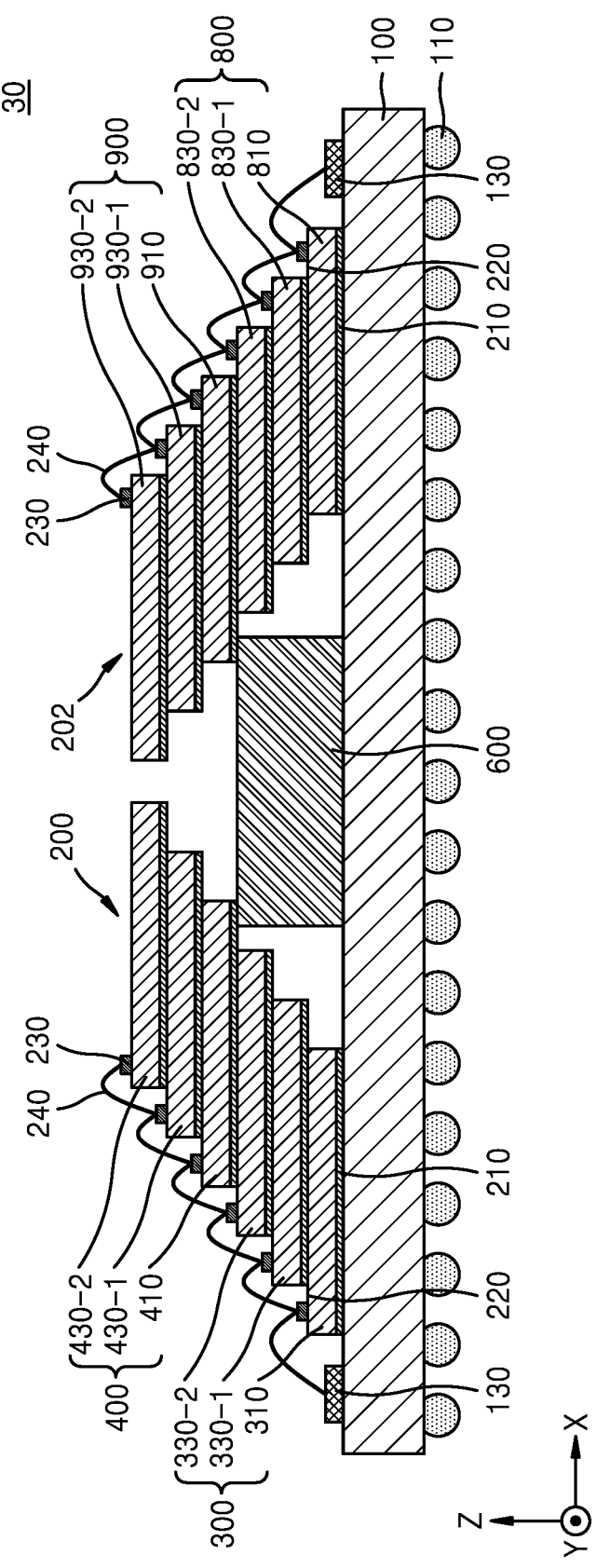
FIG. 10A is a cross-sectional view illustrating a semiconductor package according to an embodiment.
Figure 10B:
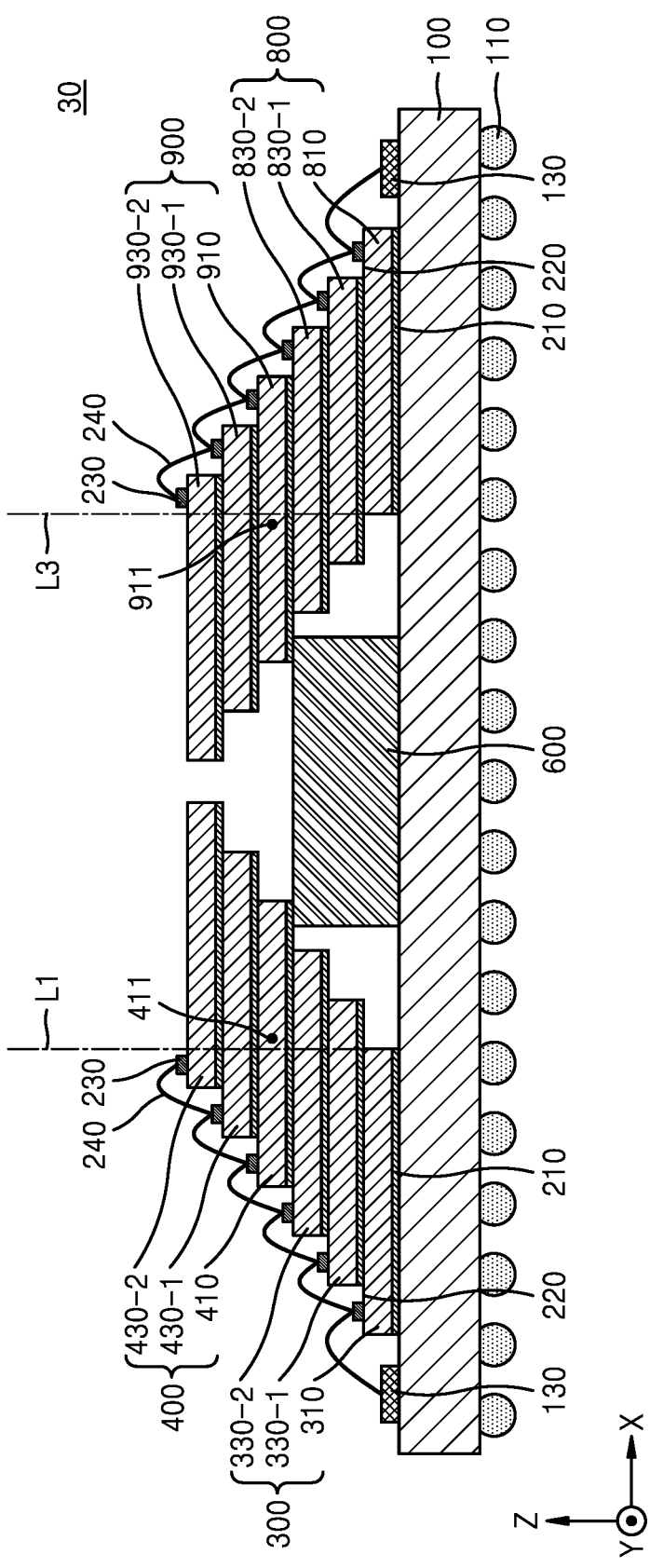
FIG. 10B is a cross-sectional view illustrating a position of a first support of the semiconductor package of FIG. 10A.

FIG. 10A is a cross-sectional view for explaining a semiconductor package 30 according to an embodiment, and FIG. 10B is a cross-sectional view for explaining the position of the first support 600 of the semiconductor package 30 of FIG. 10A. Hereinafter, overlapping contents of the semiconductor package 10 of FIG. 1A and the semiconductor package 30 of FIG. 10A will be omitted, and differences will be mainly described.

Referring to FIGS. 10A and 10B, the semiconductor package 30 may include a package substrate 100, an external connection bump 110, a substrate pad 130, a plurality of chip stacked structures 200 and 202, a bonding pad 230, a bonding wire 240, and a first support 600. The chip stacked structure 200 located on the left may include a first chip stacked structure 300 and a second chip stacked structure 400, and the chip stacked structure 202 located on the right may include a fourth chip stacked structure 800 and a fifth chip stacked structure 900.

The left chip stacked structure 200 may be substantially the same as or similar to that described with reference to FIGS. 1A to 1C, and detailed description thereof will be omitted.

The right chip stacked structure 202 includes the fourth chip stacked structure 800 and the fifth chip stacked structure 900 and may be positioned on the upper surface of the package substrate 100 in the first direction.

The fourth chip stacked structure 800 may include a fourth base chip 810 and fourth stacked chips 830-1 and 830-2, and the fifth chip stacked structure 900 may include a fifth base chip 910 and fifth stacked chips 930-1 and 930-2.

The fourth base chip 810 may be positioned on the upper surface of the package substrate 100, and the fourth stacked chips 830-1 and 830-2 may be positioned on the fourth base chip 810. According to embodiments, the fourth stacked chips 830-1 and 830-2 may be sequentially offset-stacked along the second direction (−X axis) on the upper surface of the fourth base chip 810. For example, the fourth stacked chips 830-1 and 830-2 may be stacked on the fourth base chip 810 in a cascade type, e.g., a step type, in the second direction.

The fourth base chip 810 may be adhered to and fixed on the upper surface of the package substrate 100 through an adhesive layer 210, the fourth stacked chip 830-1 may be adhered to and fixed on the upper surface of the fourth base chip 810 through an adhesive layer 210, and another fourth stacked chip 830-2 may be adhered to and fixed on the upper surface of the fourth stacked chip 830-1 through an adhesive layer 210.

The fifth chip stacked structure 900 is disposed on the upper surface of the fourth chip stacked structure 800, and may include a fifth base chip 910 and fifth stacked chips 930-1 and 930-2. The fifth base chip 910 may be positioned on the upper surface of the fourth chip stacked structure 800, and the fifth stacked chips 930-1 and 930-2 may be positioned on the fifth base chip 910.

According to embodiments, the fifth stacked chips 930-1 and 930-2 may be sequentially offset-stacked along the second direction on the upper surface of the fifth base chip 910. For example, the fifth stacked chips 930-1 and 930-2 may be stacked on the fifth base chip 910 in a cascade type, e.g., a step type, in the second direction.

The fifth base chip 910 may be adhered to and fixed on the upper surface of the fourth chip stacked structure 800 through an adhesive layer 210, the fifth stacked chip 930-1 may be adhered to and fixed on the upper surface of the fifth base chip 910 through an adhesive layer, and another fifth stacked chip 930-2 may be adhered to and fixed on the upper surface of the fifth stacked chip 930-1 through an adhesive layer.

In embodiments, on the upper surface of the first support 600, the first support 600 may be spaced apart from the first chip stacked structure 300 in the first direction, and may be spaced apart from the fourth chip stacked structure 800 in the second direction. The first support 600 supports/contacts the lower surface of the second base chip 410 to support the second chip stacked structure 400, and at the same time, supports/contacts the lower surface of the fifth base chip 910 to support the fifth chip stacked structure 900. In embodiments, the first support 600 supports/contacts an end portion of a lower surface of the second base chip 410 in the first direction to support the second chip stacked structure 400 and at the same time, supports/contacts an end portion of a lower surface of the fifth base chip 910 in the second direction to support the fifth chip stacked structure 900.

The third imaginary line L3 may be a line extending in a vertical direction (Z-axis direction) from a side surface of the fourth base chip 810 at an end in the second direction. For example, the third imaginary line L3 may be a line extending perpendicularly to the upper surface of the package substrate 100 from the left (−X-axis direction) end of the fourth base chip 810.

The fifth base chip 910 may be a stacked chip positioned at the lowermost level/end among the stacked chips in a chip stacked structure 202 in which the centers of the chips are located on the second direction side (left-hand side) from the third imaginary line L3. For example, the fifth base chip 910 may be a chip located at the lowermost level/end while the center of the chip is located at the left-hand side from the third imaginary line L3 among the chips stacked in the chip stacked structure 202.

The fifth base chip 910 may be a criterion for distinguishing the fourth chip stacked structure 800 from the fifth chip stacked structure 900. Based on the fifth base chip 910, the fourth chip stacked structure 800 includes chips stacked/placed under the fifth base chip 910, and the fifth chip stacked structure 900 may include a fifth base chip 910 and chips stacked/positioned on/above the fifth base chip 910.

The position of the fifth base chip 910 will be described in more detail below.

The chips stacked in the chip stacked structure 202 may include chips offset-stacked in a cascade type, e.g., a step type, in the second direction. In the offset stacking chips, the center of the chips may be positioned/arranged in the second direction, e.g., on the left-hand side, from a chip placed immediately below the chip due to the cascade type stacking. For example, the center of the chip at a lower level may be located in the first direction, e.g., to the right-hand side from the chip that is offset-stacked (positioned) at a directly upper level.

In the semiconductor package 30 of the inventive concept, among the chips stacked in the cascade type in the chip stacked structure 202, a chip located at the lowermost level/end among the chips having the center of the chip located at the left side with respect to or from the third imaginary line L3 may be specified as the fifth base chip 910. When the fifth base chip 910 is specified, among the chips stacked in the chip stacked structure 202, chips offset-stacked along the second direction on the upper surface of the fifth base chip 910 may be specified as fifth stacked chips 930-1 and 930-2, and a set of the fifth base chip 910 and the fifth stacked chips 930-1 and 930-2 may be a fifth chip stacked structure 900.

In addition, as the fifth base chip 910 is specified, the chip located just below the fifth base chip 910 may be the fourth stacked chip 830-2 located at the uppermost end of the fourth chip stacked structure 800, and a set of stacked chips from the fourth base chip 810 to the fourth stacked chip 830-2 may be the fourth chip stacked structure 800.

As a result, the first support 600 supports/contacts the second base chip 410, e.g., a chip located at the lower most level/end among the chips in the chip stacked structure 200 of which center is located on the right-hand side from the right end of the first base chip 310, to support the second chip stacked structure 400 and at the same time, supports/contacts the fifth base chip 910, e.g., a chip located at the lowermost level/end of among chips in the chip stacked structure 202 of which center is located on the left-hand side from the left end of the fourth base chip 810 to support the fifth chip stacked structure 900.

The semiconductor package 30 of the inventive concept appropriately defines the position of the first support 600, so that loads of the plurality of chip stacked structures 200 and 202 may be efficiently distributed/dispersed/dissipated, and a moment applied to the stacked chips may be effectively offset.

For example, as the semiconductor package 30 of the inventive concept appropriately limits the position of the first support 600, the semiconductor package 30 is beneficial to efficiently prevent cracking of chips stacked on the package substrate 100 and provide a reliable semiconductor package.

Figure 11:
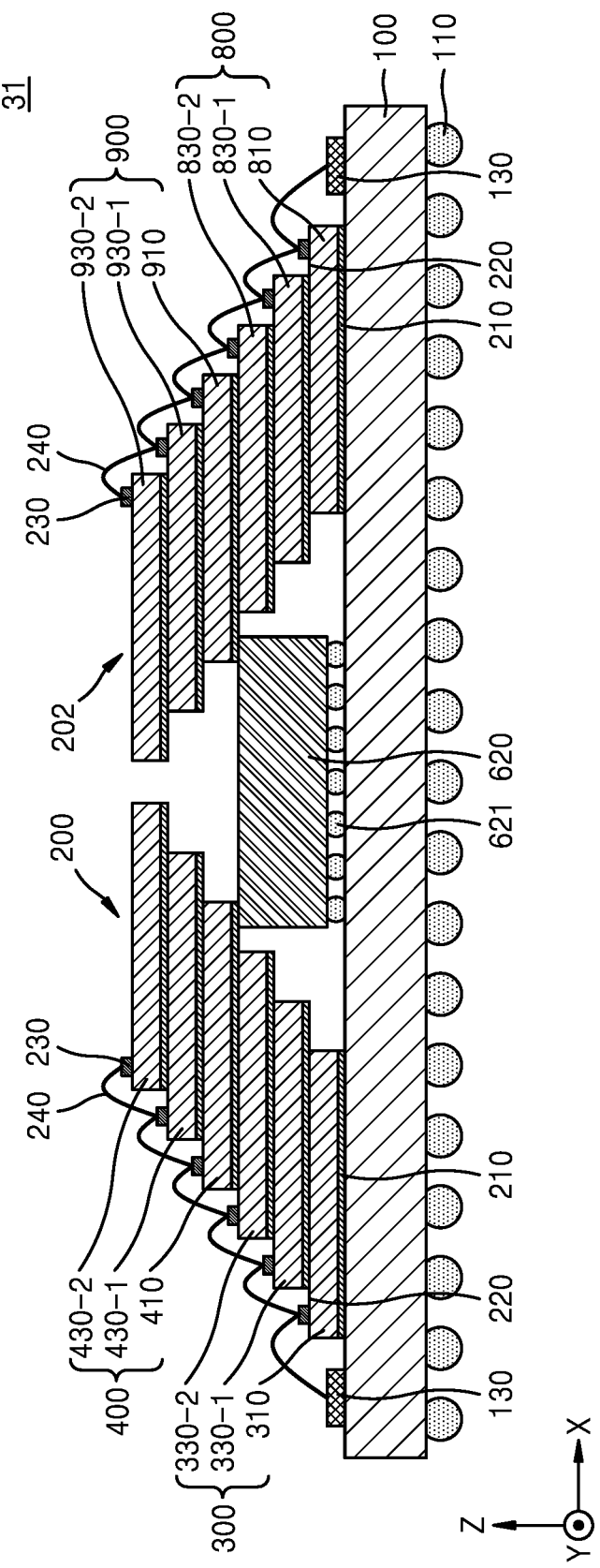
FIG. 11 is a cross-sectional view illustrating a semiconductor package according to an embodiment.

FIG. 11 is a cross-sectional view illustrating a semiconductor package 31 according to an embodiment. Hereinafter, overlapping contents of the semiconductor package 30 of FIG. 10A and the semiconductor package 31 of FIG. 11 will be omitted, and differences will be mainly described.

Referring to FIG. 11, the semiconductor package 31 may include a package substrate 100, an external connection bump 110, a substrate pad 130, a plurality of chip stacked structures 200 and 202, a bonding pad 230, a bonding wire 240, a first support 620, and a connection bump 621. The chip stacked structure 200 located on the left may include a first chip stacked structure 300 and a second chip stacked structure 400, and the chip stacked structure 202 located on the right may include a fourth chip stacked structure 800 and a fifth chip stacked structure 900.

According to embodiments, the first support 620 is a semiconductor chip, and may be a controller chip, an FBI chip, or a D-RAM chip.

According to embodiments, the semiconductor package 31 uses a controller chip serving as a controller for the chips in the plurality of chip stacked structures 200 and 202 as the first support 620, such that the size of the semiconductor package may be reduced.

According to embodiments, the semiconductor package 31 uses the FBI chip serving as an interface to change an input frequency and transmit the changed input frequency to each semiconductor chip as the first support 620, such that the size of the semiconductor package may be reduced.

According to embodiments, the semiconductor package 31 uses a D-RAM chip, which is a heterogeneous semiconductor device mounted together with a plurality of chip stacked structures 200 and 202, as the first support 620, such that the size of the semiconductor package may be reduced.

In this case, the first support 620 may be electrically connected to the package substrate 100 through the connection bump 621.

Various chip stacked structures described above may be each a chip stack and/or stacked chips.

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally unless the context indicates otherwise.

While the inventive concept has been particularly shown and described with reference to embodiments thereof, it will be understood that various changes in form and details may be made therein without departing from the spirit and scope of the following claims.

What is claimed is:

1. A semiconductor package comprising:

a package substrate including a substrate pad;

a first chip stacked structure comprising first chips including a first base chip mounted on an upper surface of the package substrate, and one or more first stacked chips sequentially offset-stacked on the first base chip such that each of the first stacked chips protrudes beyond a side surface of an adjacent lower first chip in a first direction;

a second chip stacked structure comprising second chips including a second base chip offset-stacked along the first direction and mounted on an upper surface of an uppermost one of the first stacked chips of the first chip stacked structure, and one or more second stacked chips sequentially offset-stacked on the second base chip such that each of the second stacked chips protrudes beyond a side surface of an adjacent lower second chip in the first direction;

a bonding wire electrically connecting the substrate pad to at least one of the first chip stacked structure and the second chip stacked structure; and a support mounted on the upper surface of the package substrate spaced apart from the first chip stacked structure in the first direction and supporting the second chip stacked structure, wherein the support supports a portion of a lower surface of the second base chip, wherein a center of each of the second chips does not vertically overlap the first base chip, and wherein the second base chip is a lowermost second chip of the second chips.

2. The semiconductor package of claim 1, wherein the second stacked chip structure completely overlaps the support in a vertical direction.

3. The semiconductor package of claim 1, wherein the support comprises dummy silicon.

4. The semiconductor package of claim 1, wherein the support comprises a semiconductor chip.

5. The semiconductor package of claim 4, wherein the semiconductor chip comprises a controller chip.

6. The semiconductor package of claim 4, wherein the semiconductor chip comprises a frequency boosting interface (FBI).

7. The semiconductor package of claim 4, wherein the semiconductor chip comprises a dynamic random access memory (DRAM).

8. The semiconductor package of claim 1, wherein the support comprises a first semiconductor chip mounted on an upper surface of the package substrate and a second semiconductor chip stacked on an upper surface of the first semiconductor chip.

9. The semiconductor package of claim 1, wherein the support is one of a plurality of supports, wherein each support of the plurality of supports are spaced apart from each other in the first direction and positioned on the upper surface of the package substrate.

10. The semiconductor package of claim 9, wherein each support of the plurality of supports is a semiconductor chip.

11. The semiconductor package of claim 10, wherein a first support of the plurality of supports comprises a controller chip and a second support of the plurality of supports comprises a DRAM chip.

12. A semiconductor package comprising:

a package substrate including a substrate pad;

a first chip stacked structure comprising first chips including a first base chip mounted on an upper surface of the package substrate, and one or more first stacked chips sequentially offset-stacked on the first base chip such that each of the first stacked chips protrudes beyond a side surface of an adjacent lower first chip in a first direction;

a second chip stacked structure comprising second chips including a second base chip offset-stacked along the first direction and mounted on an upper surface of an uppermost one of the first stacked chips of the first chip stacked structure, and one or more second stacked chips sequentially offset-stacked along the first direction on the second base chip such that each of the second stacked chips protrudes beyond a side surface of an adjacent lower second chip in the first direction;

a third chip stacked structure comprising third chips including a third base chip offset-stacked along the first direction and mounted on an upper surface of an uppermost one of the second stacked chips of the second chip stacked structure, and one or more third stacked chips sequentially offset-stacked along the first direction on the third base chip such that each of the third stacked chips protrudes beyond a side surface of an adjacent lower third chip in the first direction;

a bonding wire electrically connecting the substrate pad to at least one of the first chip stacked structure and the second chip stacked structure;

a first support mounted on the upper surface of the package substrate, spaced apart from the first chip stacked structure in the first direction, and supporting the second chip stacked structure; and a second support spaced apart from the first and second chip stacked structures in the first direction and supporting the third chip stacked structure, wherein the first support supports the second chip stacked structure by supporting a lower surface of the second base chip, wherein the second support supports the third chip stacked structure by supporting a lower surface of the third base chip, wherein a center of each of the second chips does not vertically overlap the first base chip, wherein a center of each of the third chips does not vertically overlap the second base chip, and wherein the second base chip is a lowermost one of the second chips and the third base chip is a lowermost one of the third chips.

13. The semiconductor package of claim 12, wherein the second support is located on an upper surface of the first support.

14. The semiconductor package of claim 12, wherein the second support is spaced apart from the first support in the first direction and is positioned on the upper surface of the package substrate.

15. The semiconductor package of claim 12, wherein the first support and the second support each comprise dummy silicon.

16. The semiconductor package of claim 12, wherein the first support and the second support each comprise a semiconductor chip.

17. A semiconductor package comprising:

a package substrate including a substrate pad;

a first chip stacked structure comprising first chips including a first base chip mounted on an upper surface of the package substrate, and one or more first stacked chips sequentially offset-stacked on the first base chip such that each of the first stacked chips protrudes beyond a side surface of an adjacent lower first chip in a first direction;

a second chip stacked structure comprising second chips including a second base chip offset-stacked and mounted on an upper surface of an uppermost one of the first chips of the first chip stacked structure, and one or more second stacked chips sequentially offset-stacked on the second base chip such that each of the second stacked chips protrudes beyond a side surface of an adjacent lower second chip in the first direction;

a third chip stacked structure comprising third chips including a third base chip mounted to be spaced apart from the first base chip in the first direction and on the upper surface of the package substrate, and one or more third stacked chips sequentially offset-stacked on the third base chip such that each of the third stacked chips protrudes beyond a side surface of an adjacent lower third chip in a second direction opposite the first direction;

a fourth chip stacked structure comprising fourth chips including a fourth base chip offset-stacked mounted on an upper surface of an uppermost one of the fourth chips of the fourth chip stacked structure, and one or more fourth stacked chips sequentially offset-stacked on the fourth base chip such that each of the fourth stacked chips protrudes beyond a side surface of an adjacent lower first chip in the second direction; and a support mounted on the upper surface of the package substrate to be spaced apart from the first chip stacked structure in the first direction and spaced apart from the third chip stacked structure in the second direction and supporting the second chip stacked structure and the fourth chip stacked structure, wherein the support supports the second chip stacked structure by supporting a lower surface of the second base chip and supports the fourth chip stacked structure by supporting a lower surface of the fourth base chip, wherein a center of each of the second chips does not vertically overlap the first base chip and a center of each of the fourth chips does not vertically overlap the third base chip, and wherein the second base chip is a lowermost one of the second chips, and the fourth base chip is a lowermost one of the fourth chips.

18. The semiconductor package of claim 17, wherein a vertical distance from the upper surface of the package substrate to the lower surface of the second base chip is equal to a vertical distance from the upper surface of the package substrate to the lower surface of the fourth base chip.

19. The semiconductor package of claim 17, wherein the support comprises a semiconductor chip.

20. The semiconductor package of claim 19, wherein the semiconductor chip comprises a controller chip.

* * * * *